United States Patent [19]

Tracy et al.

[11] 4,273,828

[45] Jun. 16, 1981

[54] BULK GLASS HAVING IMPROVED PROPERTIES

[75] Inventors: Chester E. Tracy, South River; Werner Kern, Hightstown, both of N.J.

[73] Assignee: RCA Corporation, New York, N.Y.

[21] Appl. No.: 66,334

[22] Filed: Aug. 14, 1979

[51] Int. Cl.³ .............................................. B32B 9/00
[52] U.S. Cl. .................................. 428/336; 428/428; 428/446; 427/39
[58] Field of Search .................. 428/428, 446, 336; 427/39

[56] References Cited

U.S. PATENT DOCUMENTS 3,549,411  12/1970  Bean et al. ............................. 427/39
4,118,211  10/1978  Coin ...................................... 427/163

OTHER PUBLICATIONS

"Advances in Deposition Processes for Passivation Films" by Kern et al., *Journal of Vacuum Science & Technology* vol. 14, No. 5, Sep./Oct. 1977 pp. 1082–1099.
"Silicon Oxide & Nitride Films Deposited by an R.F. Glow Discharge" by Joyce et al., Thin Solid Films, 1 (67/68) pp. 481–494.
*Applied Physics Letters* vol. 32, No. 4, Feb. 15, 1978 pp. 245, 246.
*Journal of Applied Physics*, vol. 49, No. 5, May 1978 pp. 2756–2760.
*Journal of Applied Physics*, vol. 41, No. 13 Dec. 1970 pp. 5115–5117.

*Primary Examiner*—George F. Lesmes
*Assistant Examiner*—E. Rollins Buffalow
*Attorney, Agent, or Firm*—Birgit E. Morris; Edward J. Sites

[57] ABSTRACT

Shaped bulk glass is provided which has improved properties and in particular improved compressive strength. The improvement is obtained by plasma depositing a film of amorphous polymeric hydrogenated silicon-silicon nitride on the surface of the bulk glass.

7 Claims, No Drawings

BULK GLASS HAVING IMPROVED PROPERTIES

This invention relates to bulk glass which has improved properties and to a method for the manufacture of the glass. More particularly, the invention is concerned with bulk glass which has improved long term compressive strength and improved resistance to surface damage caused by chemical or mechanical attack.

BACKGROUND OF THE INVENTION

It is well known that glass has a theoretical strength which is 500 to 1000 times greater than the design strength at which glass can be safely employed. Glass is an intrinsically strong material with observed strengths under laboratory conditions being reported to be on the order of about $7-14 \times 10^9$ dynes/cm$^2$. The theoretical strength of glass and the reported laboratory results have not heretofore had any practical significance for commercial applications of glass. It has been found to be difficult, if not impossible, to manufacture high strength glass on a commercial scale and even more difficult to maintain the glass in a high strength condition.

It is well recognized that the principal cause of the substantial differences between the theoretical strength of glass, the strengths observed under laboratory conditions and the strengths which are actually encountered in commercial production and applications is due to the presence of flaws on the surface of the glass.

Various methods have heretofore been suggested to improve the strength of glass manufactured on a commercial scale. One method was to attempt to manufacture the glass without surface defects. However, because of the inherent problems which are encountered in the production, this suggestion has not proven to be a practical solution.

An additional method which was suggested to improve the strength of glass was to after-treat the surfaces of the glass to remove surface flaws. The methods most commonly employed to remove the surface flaws are to flame polish the surface or to chemically etch the surface.

It was also suggested to subject the surface of the glass to various treatments to increase the compressive strength at the surface. One such surface treatment was to modify the surface of the glass by ion exchange wherein a portion of the smaller ions on or near the surface of the glass were displaced by larger ions.

In another suggested process organic chemical films were applied to the surface of the glass in an attempt to protect the surface of the glass.

Certain of the above processes, for example flame polishing, could, on a temporary basis, significantly increase the compressive strength at the surface of the glass. However, it was found that exposure of the glass to extremely mild conditions such as light abrasion of the glass surface, contact with normal body fluids as by contact with fingers and even mere exposure to normal ambient room moisture would induce surface flaws which reduce the compressive strength at the surface of the glass by orders of magnitude. The organic films applied to the surface of the glass did not adequately protect the glass as they were relatively soft and had poor adhesion to the glass.

The relatively low design strength of glass as compared to its theoretical strength has limited the potential uses of glass. Even in applications where it is highly desirable to use glass because of its unique desirable properties, it is generally necessary to use relatively thick glass to compensate in part for the lack of design strength.

SUMMARY OF THE INVENTION

It has been found that the physical properties of bulk glass can be improved by plasma depositing an amorphous polymeric hydrogenated silicon-silicon nitride film on the surface of the glass. The coated glass which is obtained exhibits long term improved compressive strength and improved resistance to abrasion, chemical attack and moisture.

DETAILED DESCRIPTION OF THE INVENTION

In the present invention an amorphous polymeric hydrogenated silicon-silicon nitride film is plasma deposited on the surface of the bulk glass to be strengthened. The film imparts substantial increased compressive strength to the surface of the glass on which it is applied. The additional compressive strength imparted to the surface of the bulk glass substantially increases the design strength at which the bulk glass can be utilized or, in the alternative, allows thinner cross-sectional bulk glass to be utilized, thereby saving cost and weight.

The bulk glass shapes which are advantageously treated in accordance with this invention are those which have glass as a principal structural component and in which the design strength of the product is determined at least in a substantial part by the strength of the glass.

The chemical composition of glass on which the treatment of the present invention is advantageously employed is not limited to any particular type of glass but has wide applicability to the commonly employed glasses. The most preferred chemical type of glasses for use in this invention are the silicate glasses. The process of this invention can, however, also be advantageously used with other inorganic oxide glasses such as the borate glasses, germanate glasses, phosphate glasses and the like.

The bulk glass treated in accordance with this invention can be shaped into the desired configuration by various means such as being cast, blown, spun or molded. The bulk glass can have any one of a number of final utilities. Examples of bulk glass materials which are advantageously treated in accordance with this invention are flat glasses, container glass and fiberglass. An additional important type of bulk glass product which can be treated in accordance with this invention is television picture tubes.

The maximum benefits of this invention are obtained if the bulk glass which is treated does not significantly deform so as to stress relieve the compressive forces imparted by the amorphous polymeric film. If the bulk glass does not deform in any significant amount, the film applied in accordance with this invention causes a substantial increase in compressive stresses at the surface of the glass and thereby increases the design strength of the bulk glass. The resistance to deformation which has been found to be suitable for use in this invention is an amount which is sufficient to limit the deformation induced by the amorphous polymeric film on the surface of the bulk glass to be less than 5% as compared to the untreated bulk glass. More preferably, the amount of deformation should be significantly less than 5%, with amounts of 0.5% or less being generally more preferable for most commercial products.

The amorphous polymeric hydrogenated silicon-silicon nitride films used in this invention are not suitable for imparting strength to relatively thin films of bulk glass or to the glass coatings applied to a support such as a metal substrate. The amorphous polymeric hydrogenated silicon-silicon nitride films, when applied to relatively thin films of bulk glass or on thin coatings of glass on a support substrate will impart excessive compressive stresses to the surface of the treated glass which can cause warping of the thin films and possibly the delamination of thin glass coatings from substrates.

The amorphous polymeric hydrogenated silicon-silicon nitride film which is applied to the surface of the bulk glass is comprised of amorphous hydrogenated silicon, amorphous polymeric hydrogenated silicon nitride, or a mixture thereof. The amorphous hydrogenated silicon is represented by the formula Si:H. Amorphous polymeric hydrogenated silicon nitride is represented by the formula:

$$\bond{-}(Si_xN_yH_z\bond{-})_n$$

wherein x, y, z and n are integers with the ratio of silicon to nitrogen being preferably between 0.8 to 1.0. The specific composition of the amorphous polymeric hydrogenated silicon-silicon nitride film which plasma deposits on the surface of the bulk glass is to a large extent determined by the composition of the reaction mixture utilized in the plasma reactor. If the reaction mixture contains a very high proportion of gas which will produce silicon in the reactor, such as silane, and a relatively inactive nitrogen contributing gas, such as atmospheric nitrogen, the resulting plasma deposited film will be comprised of a very high proportion of silicon and hydrogen and a minor to a trace amount of silicon nitride. On the other hand, if the reaction mixture is comprised of an active silicon contributing gas, such as silane, and an active nitrogen contributing gas, such as ammonia, the resulting plasma deposited film will reflect the composition of the reaction mixture. Satisfactory films for use in this invention can be obtained when the plasma reactor is fed with silane or a reaction mixture which consists of about one part by volume of silane to up to about 40 parts by volume of ammonia, with generally the more desirable overall properties being obtained when the reaction mixture is comprised of about 1:1 to 1:2 volume ratio of silane to ammonia.

The amorphous polymeric hydrogenated silicon-silicon nitride compositions which are used to strengthen bulk glass are well known in the art and have heretofore been used in the electronic art to coat unassembled circuit chips, electronic components and the like.

It has been found that in order to obtain the desired effect of this invention that the film of amorphous polymeric hydrogenated silicon-silicon nitride applied to the surface of the glass should have a compressive strength of at least about $0.7 \times 10^9$ dynes/cm$^2$ and preferably at least about $2.9 \times 10^9$ dynes/cm$^2$. While the above noted minimum compressive strength would be difficult, if not impossible, to obtain with certain other materials suggested to treat glass, it has been found that the minimum strength is relatively easy to obtain with the hydrogenated silicon-silicon nitride amorphous polymeric films. It is further possible to obtain films having strengths which are an order of magnitude higher than the minimum amount noted above, and even higher using the amorphous polymeric hydrogenated silicon-silicon nitride film.

One of the factors which determines the amount of compressive stress imparted by the amorphous polymeric film to the surface of the bulk glass is the relative thickness of the film and the bulk glass. It has been found in utilizing the amorphous polymeric films described above that the film deposited on the glass should be at least about 500 angstroms in thickness, and preferably at least about 700 angstroms in order to insure that a continuous, substantially pin hole free coating is deposited on the surface of the glass. There is no exact upper limit for the thickness of the films. There is, however, a practical limitation in that films in excess of 50,000 angstroms in thickness offer little advantage over thinner films and may in some cases impart an undesirable color to the coated glass.

The bulk glass on which the film is applied should have a thickness which is at least sufficient to have the required resistance to deformation noted above, that is less than about 5%. If the film imparts relatively high compressive stresses to the surface of the glass, it may be necessary to increase the ratio of the glass thickness to the film thickness in order to ensure that there is sufficient resistance to deformation to prevent distortion of the glass above the stated 5% limit. By way of example, if the glass is coated with an amorphous polymeric film which exerts a compressive stress of about $5 \times 10^9$ dynes/cm$^2$, the glass should have a thickness of which is at least about 1400 times the thickness of the film; if the film of the amorphous polymeric film exerts a compressive stress of about $30 \times 10^9$ dynes/cm$^2$, the thickness of the glass should be at least about 4500 times the thickness of the film. The overall controlling factor is that the thickness of glass should be sufficient to prevent excessive deformation of the glass by the film.

If the glass substrate is relatively thin, the amount of distortion, even if less than about 5%, may still be noticeable and objectionable. In these situations the bulk glass can be preformed so as to have a prestressed configuration so that when it is treated with the film it will reshape itself into the desired final configuration.

The amorphous polymeric hydrogenated silicon-silicon nitride film is applied to the surface of the bulk glass utilizing a plasma generator. There are various types of plasma generators known to those skilled in the art which can be utilized in the process of this invention. The selection of the particular plasma reactor is dependent upon the relative size and configuration of the bulk glass article to be coated.

The temperature at which the plasma is deposited is not particularly critical; the temperature should be sufficiently low as to be well below the softening point of the bulk glass substrate. Deposition temperatures of about 300° C. have been found to be satisfactory.

The amount of vacuum applied in the reaction chamber and the rate of feed of the reactive gases is to a large extent controlled by the particular type of reactor employed. The variations in reaction conditions which are possible and still enable one to obtain film which has the desired property for use in this invention are well within the skill of those having familiarity with this type of equipment and need not be gone into detail.

The bulk glass which is treated in accordance with this invention should advantageously be as free as possible of surface defects immediately before treatment. The glass can be pretreated to eliminate or substantially reduce defects on the surface of the bulk glass. If the glass thereafter is coated with the amorphous polymeric film before new surface defects are introduced, the film will permanently protect the surface of the glass. The final improvement in property of coated bulk glass will be a combination of the improvements in property obtained by pretreating the surface.

The amorphous polymeric hydrogenated silicon-silicon nitride film when applied to the surface of bulk glass in accordance with this invention exhibits a number of unusual properties. The film has an exceptionally strong adhesion to the glass substrate so that it cannot be removed except that rather severe chemical or mechanical processes. The film is exceptionally resistant to abrasion and protects the surface of the glass from damage. Even if the film is pierced through its entire depth and the glass surface below is damaged, the film continues to protect the glass by isolating the effect of the surface damage to approximately the area wherein the damage occurred. This was not heretofore obtainable when utilizing such treatments as flame polishing or the like, wherein a substantial flaw induced within one particular area of the glass surface would result in a propagation of the imparted weakness over the entire surface. The glass treatment further exhibits exceptionally long range stable characteristics with regard to aging, moisture, most chemicals and general environmental conditions.

The following examples are given by way of illustration of the present invention. The examples are not intended to limit in any way the scope of the present invention beyond that of the appended claims.

EXAMPLES 1-8

A series of samples were prepared in which one surface of a silicate glass disc was coated with a film of amorphous hydrogenated silicon-silicon nitride. The glass test samples which were selected had thicknesses which were substantially less than that required, in accordance with the teachings of this invention. These samples were selected in order to have a bulk glass substrate which would deform significantly in order to facilitate the evaluation of the compressive strength of the plasma deposited films. If the glass was being treated to increase the compressive stresses at the surface the glass would have been significantly thicker.

Examination of the discs before treatment revealed that the surfaces of the discs were practically flawless. The glass discs which were used as the substrates in these examples were about 750,000 angstroms thick and were obtained commercially from Corning Glass Works under the trade designation Micro-Sheet, Glass Code 0211.

The glass disc, prior to use in these examples, was measured using stress measurement by substrate deflection method. The untreated glass discs were found to be essentially free of any curvature.

The glass discs were each coated with a plasma deposited film. The discs in this test were treated with the plasma reactive product obtained with the specified combinations of silane and ammonia, as indicated in Chart I below.

The glass discs were coated in a plasma reactor of the general type described in Reinberg U.S. Pat. No. 3,757,733 issued Sept. 11, 1973.

After all the samples were coated, each sample was physically measured under a microscope to determine the compressive stresses exerted by each of the films on the glass substrate. The method of measuring utilized is described in detail in the article by W. Kern, G. L. Schnable and A. W. Fisher—"CVD Glass Films for Passivation of Silicon Devices: Composition and Stress Properties", RCA Review, volume 37, page 3, March 1976.

The compressive strengths were calculated in accordance with the formula $$S = \frac{D E T_S^2}{3(1 - P) T_F R_S^2}$$

S = stress
D = glass substrate deflection
P = Poisson's ratio of substrate
E = Young's modulus of substrate
$T_F$ = film thickness
$T_S$ = substrate thickness
$R_S$ = radius of glass disc The specific combination of process variables for each of the examples and the resulting physical properties are reported in Chart I.

CHART I

| EX. NO. | SiH$_4$/NH$_3$ RATIO | GAS FLOW SETTING STANDARD CUBIC CENTIMETER MINUTE | | | TOTAL PRESSURE $\mu$ | POWER | | DEPOSITION RATE Angstroms/Min | THICKNESS OF FINAL FILM Angstroms | COMPRESSIVE STRESS × 10$^9$ Dynes/cm$^2$ |
|---|---|---|---|---|---|---|---|---|---|---|
| | | SiH$_4$ | NH$_3$ | N$_2$ | | V | A | | | |
| 1 | 1:0 | 109 | -0- | -0- | 100 | 725 | 0.68 | 63 | 3,150 | 5.1 |
| 2 | 1:0 | 75.6 | -0- | 469 | 130 | 725 | 0.72 | 90 | 2,250 | 4.4 |
| 3 | 1:05 | 75.6 | 37.8 | 469 | 140 | 720 | 0.77 | 144 | 3,600 | 6.1 |
| 4 | 1:1 | 75.6 | 75.6 | 469 | 160 | 715 | 0.83 | 198 | 3,950 | 6.9 |
| 5 | 1:2 | 75.6 | 151 | -0- | 100 | 725 | 0.68 | 47 | 700 | 28.0 |
| 6 | 1:2 | 75.6 | 151 | 469 | 200 | 700 | 0.9 | 240 | 3,600 | 2.9 |
| 7 | 1:10 | 75.6 | 75.6 | 469 | 370 | 625 | 3.62 | 680 | 1,360 | 1.6 |
| 8 | 1:40 | 25.0 | 1000 | 469 | 470 | 525 | 3.53 | 1100 | 21,700 | 0.7 |

Deposition temperature for all examples was 300° C.

EXAMPLE 9

Silicate glass test samples were coated with the plasma reaction product of a silane-ammonia mixture in the ratio of 1:10 in a nitrogen carrier gas at a pressure of 0.26 torr at 550 watts, 300° C. for about 9.5 minutes. The thickness of the film was 3900 angstroms. The compressive strength of the film deposited on the glass was found to be 5.3 × 10$^9$ dynes/cm$^2$.

EXAMPLE 10

A second set of silicate glass samples was prepared which were coated with the plasma reaction product of a silane-ammonia mixture of the ratio of 1:2 in a nitrogen carrier gas. The deposition was made at a pressure of 0.2 torr at 495 watts and 300° C. for 9.5 minutes. The resulting film was found to have a thickness of 3840 angstroms. The compressive strength was found to be $4.4 \times 10^9$ dynes/cm$^2$.

EXAMPLE 11

Each of the coated substrates of Examples 9 and 10 were stored at ambient room temperature and relative humidity for 27 months. The samples were retested at that time and it was found that the coated substrate of Example 9 showed a 5% reduction in compressive strength and the coated substrate of Example 10 showed a 4% reduction in compressive strength, which is within a 5% experimental error of the test.

The coated substrates obtained in Examples 9 and 10, after having been stored for the 27-month period noted above, were thereafter heated gradually to 300° C. and were maintained at that temperature for a period of 15 minutes. The coated substrates were then cooled down gradually to room temperature and allowed to condition. The coated substrates were retested. It was found that the coated substrate obtained in Example 9 showed a 2% increase in compressive strength as compared to the strength as initially applied. The coated substrate obtained in Example 10 showed a 3% increase in compressive strength as compared to the sample as initially treated.

Coated substrates of material obtained in Examples 9 and 10, as described above, were treated to determine the effect of flaw inducement on the strength of the deposited film. The surface of the film of sodium nitride on both coated substrates, as well as the underlying glass substrate, was scratched with a diamond tipped stylus in the formation of a series of plus-shaped flaws. Each coated substrate was then remeasured to determine if the compressive strength of the film had been reduced. It was found that with the coated substrate of Example 9 that a 1% decrease was observed. With the coated substrate of Example 10 it was found that a 2% decrease was found. The glass substrate likewise was not substantially weakened as indicated by the fact the glass did not show any change or additional deformation.

What is claimed is:

1. A shaped bulk glass body having a film on at least a portion of the surface thereof of a plasma deposited amorphous polymeric hydrogenated silicon-silicon nitride of the formula $+Si_xN_yH_z+_n$, where x, y, z, and n are integers, said film being at least 500 angstroms in thickness and having a compressive strength of at least about $0.7 \times 10^9$ dynes/cm$^2$ and said bulk glass body having a resistance to deformation sufficient to limit the deformation induced by the film on the surface to less than about 5%.

2. The shaped bulk glass according to claim 1 wherein the said film is comprised of a member selected from the group consisting of an amorphous hydrogenated silicon, amorphous polymeric hydrogenated silicon nitride and mixtures thereof.

3. The shaped bulk glass according to claim 1 wherein the film is comprised of the plasma reaction product of about one part by volume of silane to up to about 40 parts by volume of ammonia.

4. The shaped bulk glass according to claim 1 wherein the glass is a flat glass.

5. The shaped bulk glass according to claim 1 wherein the glass is container glass.

6. The shaped bulk glass according to claim 1 wherein the glass is fiberglass.

7. The shaped bulk glass according to claim 1 wherein the glass is in the form of a television picture tube.

* * * * *